United States Patent
Xiang et al.

(10) Patent No.: US 12,417,333 B2
(45) Date of Patent: Sep. 16, 2025

(54) SHORT NET PIN ALIGNMENT FOR ROUTING

(71) Applicant: INTERNATIONAL BUSINESS MACHINES CORPORATION, Armonk, NY (US)

(72) Inventors: Hua Xiang, Ossining, NY (US); Benjamin Neil Trombley, Hopewell Junction, NY (US); Gi-Joon Nam, Chappaqua, NY (US); Gustavo Enrique Tellez, Hyde Park, NY (US); Paul G Villarrubia, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 662 days.

(21) Appl. No.: 17/656,364

(22) Filed: Mar. 24, 2022

(65) Prior Publication Data

US 2023/0306179 A1    Sep. 28, 2023

(51) Int. Cl.
    *G06F 30/3953*    (2020.01)
(52) U.S. Cl.
    CPC ................... *G06F 30/3953* (2020.01)
(58) Field of Classification Search
    USPC ........................................................ 716/128
    See application file for complete search history.

(56) References Cited

U.S. PATENT DOCUMENTS

| | | | |
|---|---|---|---|
| 6,877,148 B1 | 4/2005 | Hassibi et al. | |
| 7,137,097 B1 | 11/2006 | Aji et al. | |
| 7,921,393 B2 | 4/2011 | Furnish et al. | |
| 7,958,480 B1 | 6/2011 | Slonim et al. | |
| 8,719,754 B1 | 5/2014 | Ginetti | |
| 10,235,490 B1 | 3/2019 | Mallon et al. | |
| 11,734,485 B1 * | 8/2023 | Posser | G06F 30/392 716/129 |

FOREIGN PATENT DOCUMENTS

WO    2007149717 A2    12/2007

OTHER PUBLICATIONS

Wu, Tai-Hsuan, "A parallel integer programming approach to global routing", Dissertation, DAC '10: Proceedings of the 47th Design Automation Conference, Jun. 2010, pp. 194-199, https://doi.org/10.1145/1837274.1837323.

Yu et al., "Pin accessibility prediction and optimization with deep learning-based pin pattern recognition", 2019 56th ACM/IEEE Design Automation Conference (DAC), Article No. 220, Jun. 2019, (6 pages).

Su et al., "Pin accessibility evaluating model for improving routability of VLSI designs", 2017 30th IEEE International System-on-Chip Conference (SOCC), 2017, pp. 56-61, doi: 10.1109/SOCC.2017.8226007, (6 pages).

(Continued)

*Primary Examiner* — Bryce M Aisaka
(74) *Attorney, Agent, or Firm* — James L. Olsen

(57) ABSTRACT

Embodiments are provided for providing enhanced routing in a computing system by a processor. One or more of a plurality of short nets in a cell of an integrated circuit may be aligned for executing a routing operation, wherein a short net is a two-pin net having two gates on adjacent rows having a horizontal distance less than a selected threshold.

20 Claims, 11 Drawing Sheets

(56) References Cited

OTHER PUBLICATIONS

Seo et al., "Pin accessibility-driven cell layout redesign and placement optimization", DAC '17: Proceedings of the 54th Annual Design Automation Conference 2017, Article No. 54, pp. 1-6, https://doi.org/10.1145/3061639.3062302.

Ding et al., "Pin accessibility-driven detailed placement refinement", ISPD '17: Proceedings of the 2017 ACM on International Symposium on Physical Design, pp. 133-140, Mar. 2017, https://doi.org/10.1145/3036669.3036679 (8 pages).

Chen et al., "Pin routability and pin access analysis on standard cells for layout optimization", Mar. 20, 2018, 3 pages.

* cited by examiner

SHORT NET PIN ALIGNMENT FOR ROUTING

BACKGROUND

The present invention relates in general to computing systems, and more particularly, to various embodiments for providing short net pin alignment for routing improvement using a computing processor.

SUMMARY

According to an embodiment of the present invention, a method providing short net pin alignment for routing improvement in an integrated circuit of in a computing environment, by one or more processors, in a computing system. One or more of a plurality of short nets in a cell of an integrated circuit may be aligned for executing a routing operation, wherein a short net is a two-pin net having two gates on adjacent rows having a horizontal distance less than a selected threshold.

An embodiment includes a computer usable program product. The computer usable program product includes a computer-readable storage device, and program instructions stored on the storage device.

An embodiment includes a computer system. The computer system includes a processor, a computer-readable memory, and a computer-readable storage device, and program instructions stored on the storage device for execution by the processor via the memory.

Thus, in addition to the foregoing exemplary method embodiments, other exemplary system and computer product embodiments are provided.

DETAILED DESCRIPTION OF THE DRAWINGS

Figure 1:
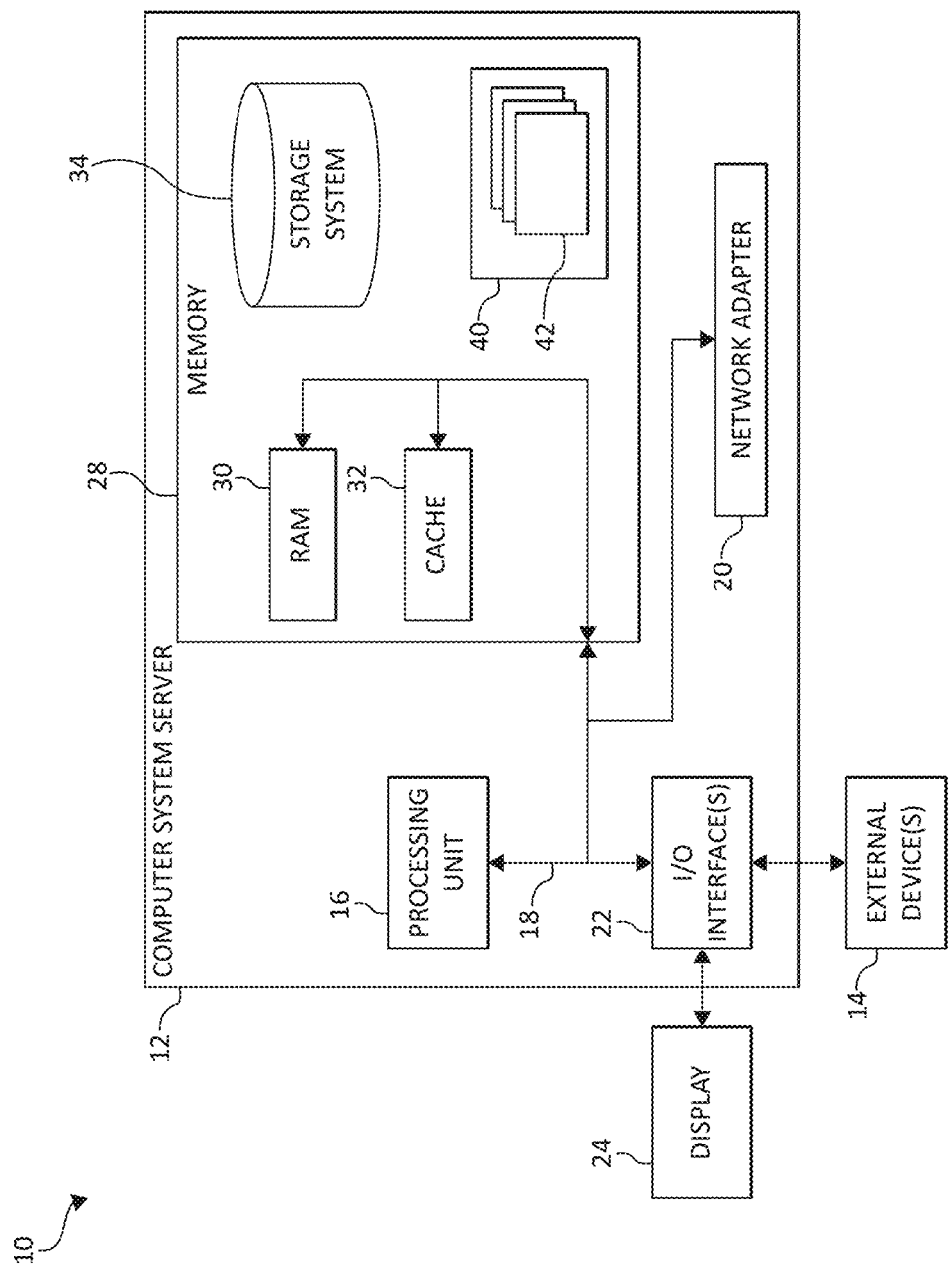
FIG. 1 is a block diagram depicting an exemplary cloud computing node according to an embodiment of the present invention.

The present invention relates generally to the field of electrical, electronic, and computer arts, and more specifically, to semiconductor Electronic Design Automation (EDA) and the like.

An integrated circuit (IC) is an electronic circuit formed using a semiconductor material, such as Silicon, as a substrate and by adding impurities to form solid-state electronic devices, such as transistors, diodes, capacitors, and resistors. Commonly known as a "chip" or a "package", an integrated circuit is generally encased in hard plastic, forming a "package". Moreover, the IC chip may include a large number of electronic components that are fabricated by layering several different materials on a silicon base or wafer. The design of an IC transforms a circuit description into a geometric description which is known as a layout. A layout typically consists of a set of planar geometric shapes in several layers. A generated layout has to be checked to ensure that it meets all of the design requirements. The result of this check is a set of design files in a particular unambiguous representation known as an intermediate form that describes the layout. The design files are then converted into pattern generator files that are used to produce patterns called "masks" by an optical or electron beam pattern generator.

The process of converting the functional specifications of an electronic circuit into the layout is called the physical design. The objective of the physical design is to determine an optimal arrangement of devices in a plane or in a three-dimensional space, and an efficient interconnection or routing scheme between the devices to obtain the desired functionality. The physical design of a microelectronic IC commonly is an automated optimization process using digital computers and specialized Computer Aided Design (CAD) tools. Automation of the physical design process has increased the level of integration, reduced turn-around time and enhanced chip performance.

For the physical design of ICs, prefabricated elements are used that provide combinatorial or storage functions. These elements are called cells (or types). A collection of different cells forms a library. The usage of a cell in a design is referred to as instance or circuit. If most of cells have the same height and connect their power through abutted placement in circuit row, the cells are called standard cells and the design style standard cell layout. A particular design element of an IC is a so-called "pin" which refers to a physical or logical access terminal to a cell and circuit. An example for a pin is an inverter having one input and one output pin.

The mentioned instances of an IC are interconnected or routed in accordance with the logical design of the circuit to provide the desired functionality. Hereby the various elements of the circuit are interconnected by electrically conductive lines or traces that are routed through vertical channels and horizontal channels that run between the cells.

In addition, IC chips typically have several metal layers upon which the wires are routed with the horizontal wires routed on different layers than the vertical wires. An electrical connection between two nets on adjacent layers is implemented using a so-called "via" which is an etched hole in a substrate's oxide for allowing a conductive path to extend from one layer to another layer of the underlying IC chip, that can be used e.g., for conducting power (so-called "power via") or even signals. The routing program must therefore produce a list of horizontal and vertical segments for each net, connected by the mentioned vias, all of which have to be conformal with the underlying technology requirements, also known as 'ground rules', for wire spacing and wire capacity.

For example, multi-layer circuits can be built such that power supply terminals ("VDD") and a ground terminal ("GND") can be accessed. For example, metal layer M0 is the first metal layer which holds the source/drain contacts and gate contact of field effect transistor (FET), for example, but may also contain interconnections in horizontal direction. M0 conductors that connect to source, drain or gate are often noted as M0 pin of standard cells. M1 is referred to as a second metal layer and is reserved for output pin or a power staple and also for routing. M2 is referred to as the third metal layer that is reserved for routing. Each of the connections between various layers are made by vertical electrical connectors that pass through the wafer called vias ("V") where, for example V0 links M0 to M1, and V1 links M1 to M2. Power staples are the functional equivalent of via contacts of nodes that connect two horizontal power rails. In another implementation, a "staple" may be defined as a conductive attachment mechanism that pierces or extends through a patch substrate and/or an illumination-system substrate at multiple points. A power staple may also be short pieces of metal connecting two or more adjacent (i.e., consecutive) power rails (e.g., VDD or VSS rails) to mitigate the IR drop. In some implementation, the power staple may be a short straight line power staple. A power staple may also be a solid conductive fastener.

Moreover, the IC chip is fabricated by first conceiving the logical circuit description, and then converting that logical description into the physical description, or the geometric layout. This process is usually carried out using a "netlist," which is a record of all of the nets, or interconnections, between the cell pins. Every net is classified into one of four different categories: short nets, flat nets, L-shaped nets, and Z-shaped nets. A short net is a net that locates in one tile or bin. A flat net spans at most one tile in either the vertical or horizontal direction. An L-shaped net or a Z-shaped net spans more than one tile in either direction and have one or two bends, respectively. A short net is a two-pin net whose two gates are on adjacent rows and a horizontal distance is less than a given threshold (e.g., less than 5 placement tracks). For a multiple-pin net, if two pin connection is close (e.g., less than five placement tracks), the multiple-pin net can also be treated as a short net.

Challenges arise that effect routing particularly for short net pin alignment where a straight connection is favored by very short nets. Accordingly, the present invention provides a novel solution by providing short net pin alignment for routing improvement in an integrated circuit of in a computing environment, by one or more processors, in a computing system. One or more of a plurality of short nets in a cell of an integrated circuit may be aligned for executing a routing operation, wherein a short net is a two-pin net having two gates on adjacent rows having a horizontal distance less than a selected threshold.

In some implementations, for short net pin alignment, a heuristic approach may be used to process each pair one by one. In other implementations, an Integer Linear Programming ("ILP") operation may be performed to simultaneously process multiple pairs. To minimize the disturbance, the ordering of gates may be kept along each circuit row unchanged. The gates may be shifted left and/or right within a given threshold.

In other implementations, the present invention provides for a two-stage flow is proposed to align gate pins for short nets. A heuristic algorithm is uses to align gate pins pair by pair. An ILP (Integer Linear Programming) operation is used to simultaneous align multiple short nets. A graph partition operation is used to reduce a problem size (e.g., the problem size can be measured as a number of nodes and edges in a graph) and handle ILP failure. An integrated flow is presented to combine both the ILP operation and the heuristic operation to maximize the improvement.

It should be noted that in general, as used herein, "wireability" may be defined as a metric to determine whether a given cell placement can be completely connected both automatically and/or manually given a specified number of wiring planes and fixed blockage. "Congestion" may be defined as the ratio of the occupied area of a design to the total area of the design. A "power rail" may be defined as a long, narrow power rectangle placed horizontally or vertically on a conductive metal wiring level. A three-dimensional "power grid" may be defined by stacking metal levels of alternating horizontal and vertical power rails periodically placed as to permit signal routing in between adjacent rails on the same level. For example, power rails on adjacent conductive levels may be interconnected through vias in insulating layers separating the conductive levels. Conductive metal levels may use notation M1, M2, M3, etc. to indicate the level in an integrated circuit at which the conductive level resides.

Also, as used herein, "optimize" may refer to and/or defined as "maximize," "minimize," "best," or attain one or more specific targets, objectives, goals, or intentions. Optimize may also refer to maximizing a benefit to a user (e.g., maximize a trained machine learning pipeline/model benefit). Optimize may also refer to making the most effective or functional use of a situation, opportunity, or resource.

Additionally, optimizing need not refer to a best solution or result but may refer to a solution or result that "is good enough" for a particular application, for example. In some implementations, an objective is to suggest a "best" combination of preprocessing operations ("preprocessors") and/or machine learning models/machine learning pipelines, but there may be a variety of factors that may result in alternate suggestion of a combination of preprocessing operations ("preprocessors") and/or machine learning models yielding better results. Herein, the term "optimize" may refer to such results based on minima (or maxima, depending on what parameters are considered in the optimization problem). In an additional aspect, the terms "optimize" and/or "optimizing" may refer to an operation performed in order to achieve an improved result such as reduced execution costs or increased resource utilization, whether or not the optimum result is actually achieved. Similarly, the term "optimize" may refer to a component for performing such an improvement operation, and the term "optimized" may be used to describe the result of such an improvement operation.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random-access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, system memory 28 may include at least one program product having a set (e.g., at least one) of program modules that are configured to carry out the functions of embodiments of the invention.

Program/utility 40, having a set (at least one) of program modules 42, may be stored in system memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
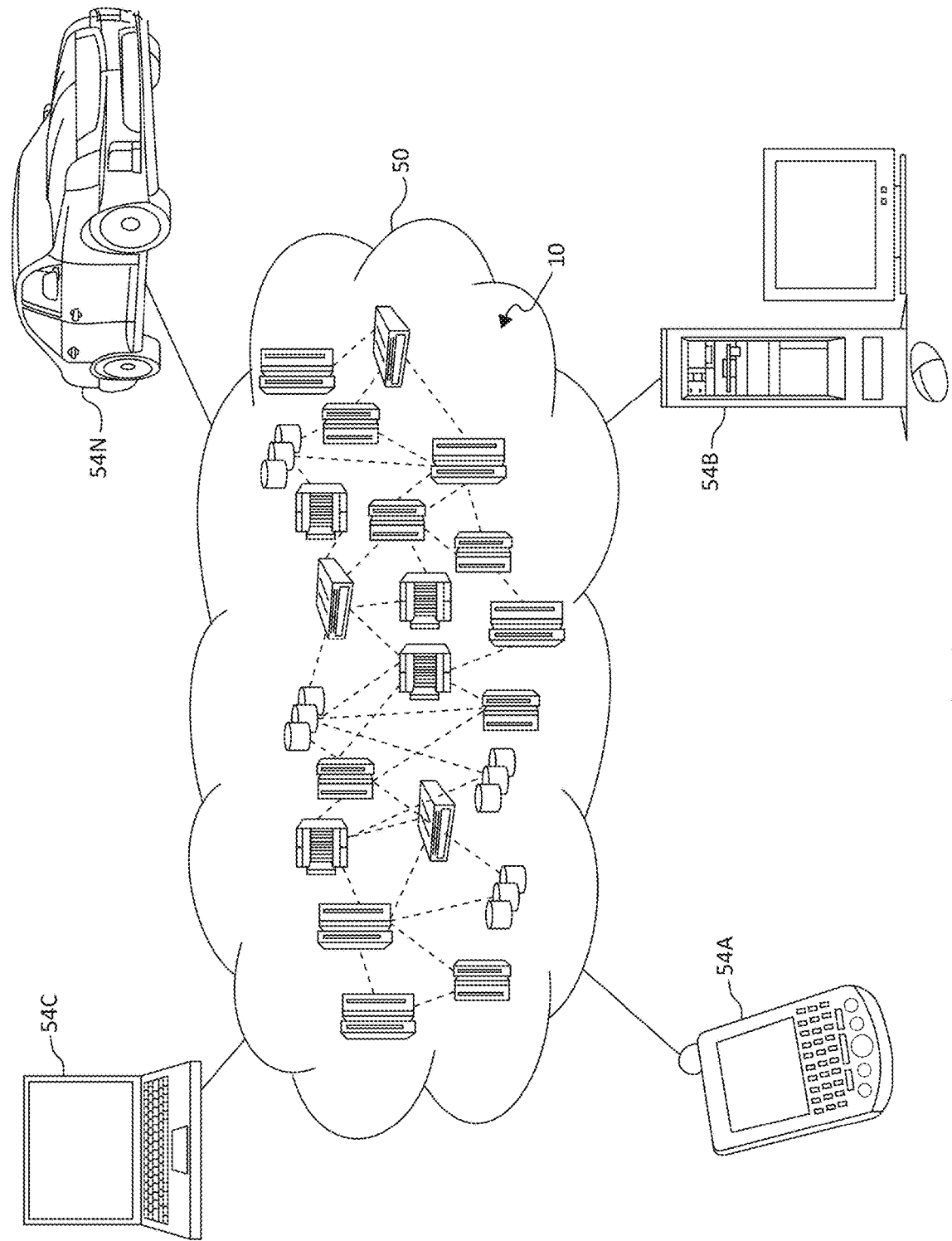
FIG. 2 is an additional block diagram depicting an exemplary cloud computing environment according to an embodiment of the present invention.

Referring now to FIG. 2, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
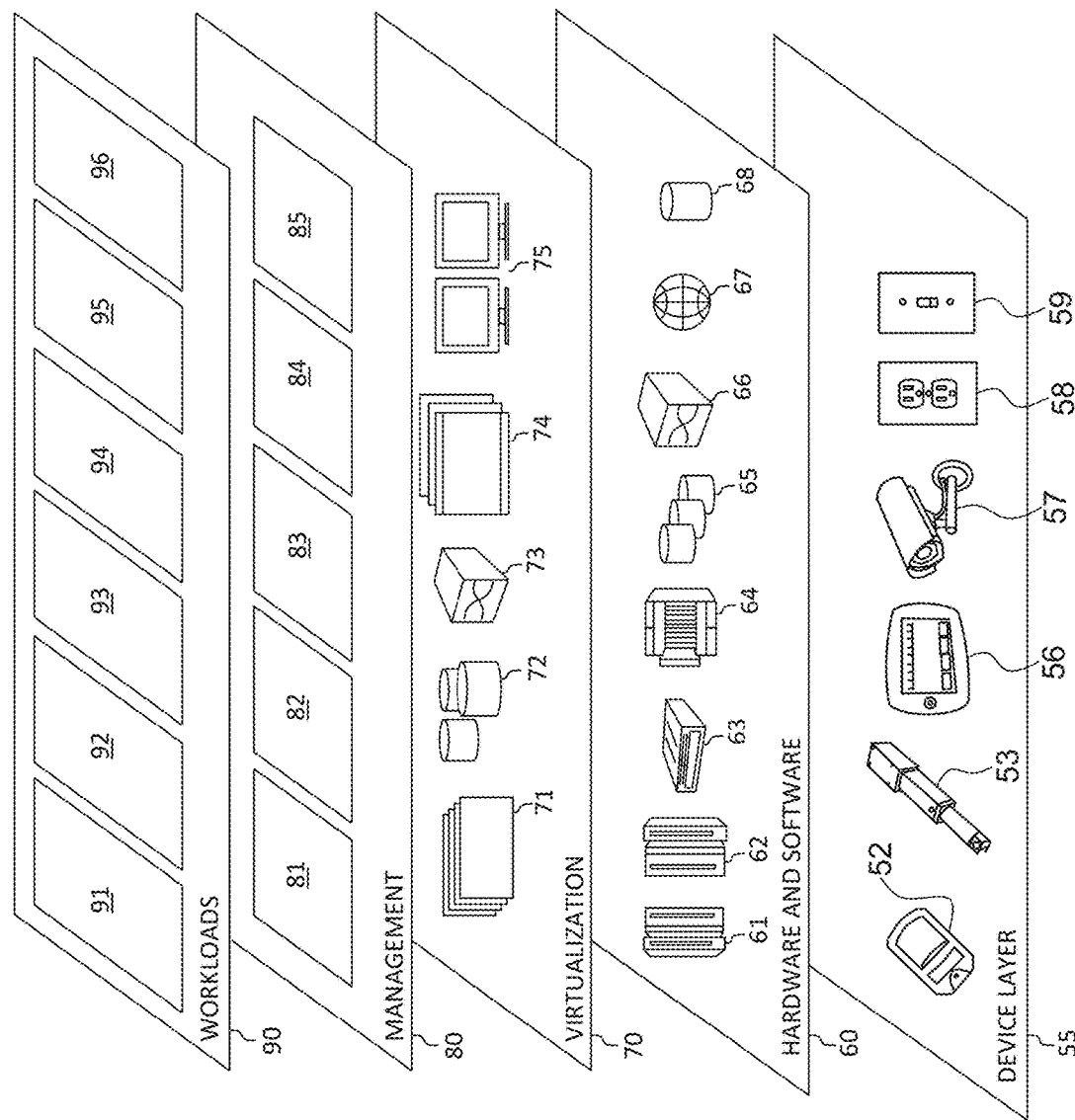
FIG. 3 is an additional block diagram depicting abstraction model layers according to an embodiment of the present invention.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Device layer 55 includes physical and/or virtual devices, embedded with and/or standalone electronics, sensors, actuators, and other objects to perform various tasks in a cloud computing environment 50. Each of the devices in the device layer 55 incorporates networking capability to other functional abstraction layers such that information obtained from the devices may be provided thereto, and/or information from the other abstraction layers may be provided to the devices. In one embodiment, the various devices inclusive of the device layer 55 may incorporate a network of entities collectively known as the "internet of things" (IoT). Such a network of entities allows for intercommunication, collection, and dissemination of data to accomplish a great variety of purposes, as one of ordinary skill in the art will appreciate.

Device layer 55 as shown includes sensor 52, actuator 53, "learning" thermostat 56 with integrated processing, sensor, and networking electronics, camera 57, controllable household outlet/receptacle 58, and controllable electrical switch 59 as shown. Other possible devices may include, but are not limited to various additional sensor devices, networking devices, electronics devices (such as a remote-control device), additional actuator devices, so called "smart" appliances such as a refrigerator or washer/dryer, and a wide variety of other possible interconnected objects.

Hardware and software layer 60 includes hardware and software components. Examples of hardware components include: mainframes 61; RISC (Reduced Instruction Set Computer) architecture-based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provides cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provides pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and, in the context of the illustrated embodiments of the present invention, various workloads and functions 96 providing short net pin alignment in a computing environment (e.g., in a neural network architecture). In addition, workloads and functions 96 for providing short net pin alignment in a computing environment may include such operations as analytics, deep learning, and as will be further described, user and device management functions. One of ordinary skill in the art will appreciate that the workloads and functions 96 for providing short net pin alignment in a computing environment may also work in conjunction with other portions of the various abstractions layers, such as those in hardware and software 60, virtualization 70, management 80, and other workloads 90 (such as data analytics processing 94, for example) to accomplish the various purposes of the illustrated embodiments of the present invention.

Figure 4A:
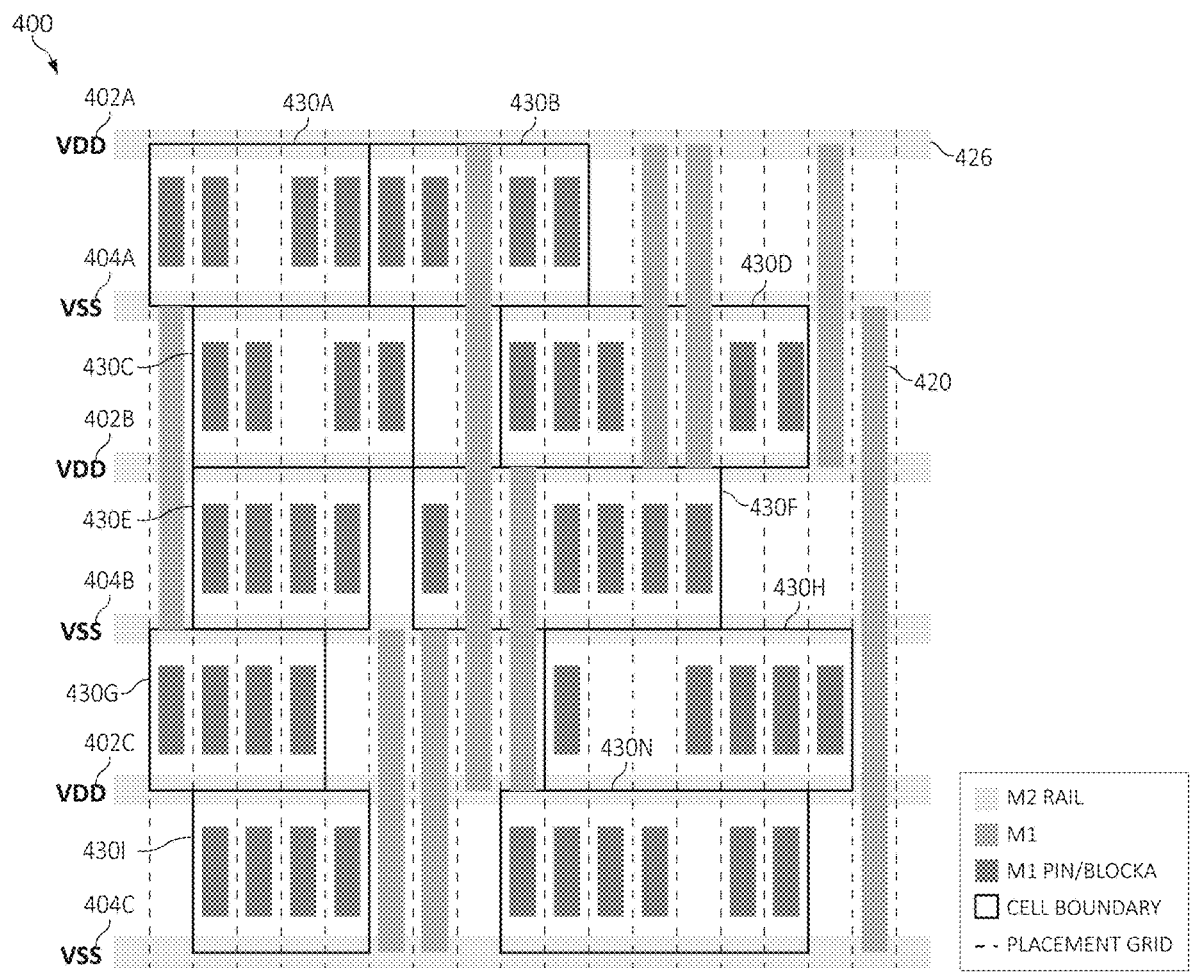
FIG. 4A is a block diagram depicting power staple insertions operations according to an embodiment of the present invention.

For further explanation, FIG. 4A is a power delivery network 400 ("PDN") of an integrated circuit (e.g., a field effect transistor (FET)) having a power (VDD) 402A-C and ground (VSS) 404A-C through the PDN 400. In one aspect, the PDN 400 includes multi-layer circuits of field effect transistor (FET) such as, for example, M1 and M2 layers, with an M2 rail 426 with a plurality of M1 pin/blockages. The PDN 400 also includes a plurality of cells 430A-N. A placement grid is also depicted as the dashed lines in PDN 400.

It should be noted that the PDN 400, having the higher metal layers M1 and M2 and power rails on one or two lower metal layers may be stacked vias in between. However, power staples are used and inserted, as compared to via in PDN 400, for improving PDN robustness in sub-10 nm technologies. In one aspect, power staples are short pieces of metal connecting two or more adjacent (i.e., consecutive) VDD (e.g., one or more of the VDD 402A-C) or VSS rails (e.g., one or more of the VDD 404A-C), to mitigate the current ("IR") drop.

As depicted, adjacent M2 rails 426 (e.g., VDD-VDD, or VSS-VSS) are connected by power staples in M1. Since each power staple goes across at least two cell rows, vertical track availability in the context of standard cell pins and pre-routes is crucial to achieve sufficient power staple insertion.

Figure 4B:
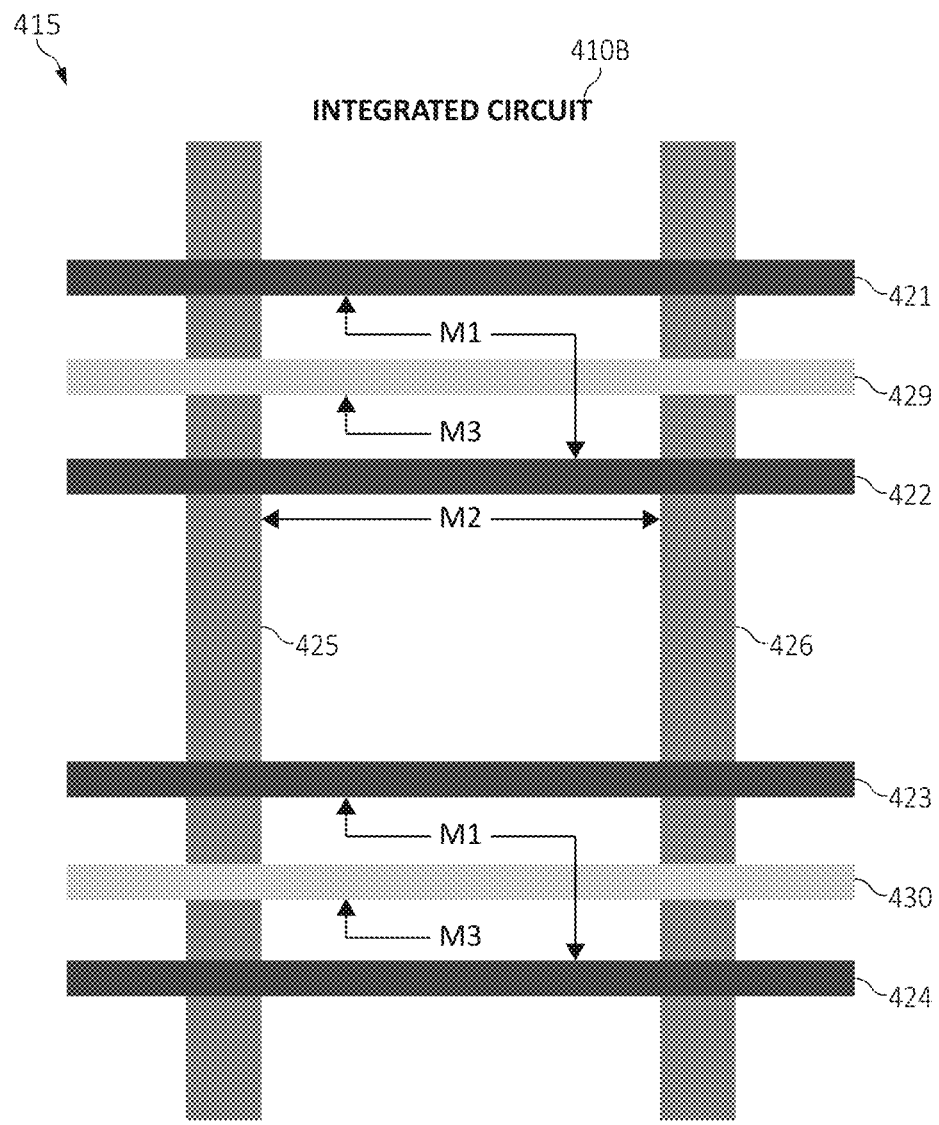
FIG. 4B is a block diagram depicting power rail placement of one polarity of power, as VDD or GND, with horizontal M1 and M3 power rails connected by power vias to vertical M2 power rails.

For further explanation, FIG. 4B, is a block diagram 415 depicting power rail placement of one polarity of power, as VDD or GND, with horizontal M1 and M3 power rails connected by power vias to vertical M2 power rails. In FIG. 4B, an example power rail placement for one polarity of power is shown wherein the M2 power rails 425 and 426 connect by power vias to M1 power rails 421, 422, 423 and 424 and M3 power rails 429 and 430.

As previously mentioned, the present invention provides a novel solution of short net pin alignment for routing improvement in an integrated circuit of in a computing environment. One or more of a plurality of short nets in a cell of an integrated circuit may be aligned for executing a routing operation, wherein a short net is a two-pin net having two gates on adjacent rows having a horizontal distance less than a selected threshold.

Figure 5:
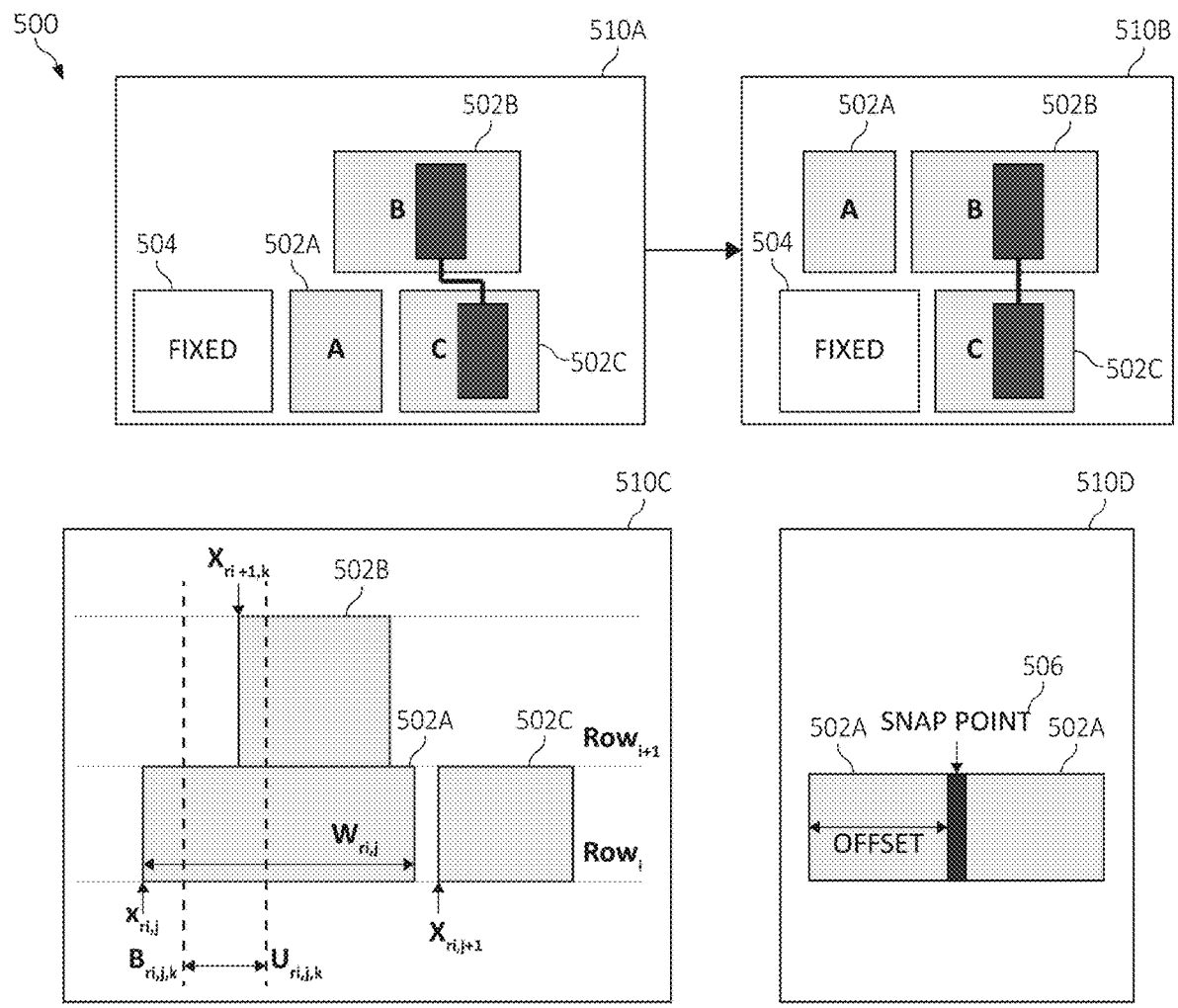
FIG. 5 is a block diagram depicting an exemplary operations for providing short net pin alignment for routing of an integrated circuit in which aspects of the present invention may be realized.

FIG. 5 is a block diagram 500 depicting an exemplary operations for providing short net pin alignment of an integrated circuit in which aspects of the present invention may be realized. In one aspect, one or more of the components, modules, services, applications, and/or functions described in FIGS. 1-4A-4B may be used in FIG. 5.

As depicted, sections 510A-D of an integrated circuit of an integrated circuit having one or more pins such as, for example, pins A, B, and C and one or more gates such as, for example, gates 502A-C, fixed gate 504.

In some implementations, for short net pin alignment, a heuristic approach may be used to process each pair one by one (e.g., pins B and C of gates 502B and 502C, respectively), as depicted in sections 510A and 510B.

For the heuristic approach, each circuit row may be looped from bottom to top. As such, operations may identify or find a list of pins that belong to a short net such as for example, pins B and C for a short net. For each pin in the list, the operations may identify the pin that belongs to a specific gate and then moves to the next gate. Each gate such as, for example, gate 502B may be changed/moved to various location to align with the other pin. For example, gate 502B is moved causing pin B to align with pin C of gate 502, which is depicted moving from section 510A to section 510B.

Other gates may also be changed in order to avoid gate overlapping such as, for example, moving gate 502A having pin A. A cost is determined calculated to evaluate each location change. In one aspect, the cost is a penalty if a certain change is made and the target is to minimize the cost (e.g., minimizing design changes). Also, the location change with the most efficient or optimized cost is determined. Also, one or more gates may be set to the location with the best cost such as, for example, moving gates 502B and 502A, as depicted in sections 510A and 510B.

In other implementations, an Integer Linear Programming ("ILP") operation may be performed to simultaneously process multiple pairs, as depicted in sections 510C and 510D. To minimize the disturbance, the ordering of gates may be kept along each circuit row unchanged. The gates may be shifted left and/or right within a given threshold.

Thus, multiple short nets may be simultaneously processed and the ILP operations optimally identifies/finds the net alignments with minimum location changes. For each gate $g_{r,j}$, xlow is $x_{r,j}$ where x is the x axis and y is the y-axis) and the width is $w_{r,j}$, and the original xlow is $x'_{r,j}$. For non-overlap, where a gate cannot be on top of each other and a gate can be viewed as a rectangle so two gate rectangles cannot overlap), the following equation may be used for the non-overlap constraint:

$$x_{r_i,j} + w_{r_i,j} + x_{r_i,j+1} \quad (1)$$

A boundary constraint is a gate cannot be placed outside the circuit chip (e.g., "chip" defines the boundary of the entire circuit design). A chip is viewed as a rectangle. All gates should be placed inside the rectangle. For the chip low boundary constraint, the following equations may be used:

$$\text{chip}_{xlow} \leq x_{r_i,0} \quad (2)$$

and the $\text{chip}_{xhigh}$ is a boundary constraint is $$x_{r_i,N} + w_{r_i,j} \leq \text{chip}_{xhigh} \quad (3),$$

Also, for determining a gate movement range, the following equations may be used:

$$|-x'_{r_i,j}| \leq d_{move} \quad (4),$$

For determining the upper alignment constraint (e.g., alignment upper constraint), the following equations may be used:

$$x_{r_i,j} - x_{r_{i+1},k} \leq U_{r_i,j,k} \quad (5),$$

For determining the lower alignment constraint (e.g., alignment lower constraint), the following equations may be used:

$$B_{r_i,j,k} \leq x_{r_i,j} - x_{r_{i+1},k} \quad (6),$$

used to target and minimize the gate location change as depicted in sections 510C and 510D.

More specifically, as illustrated in section 510D, gate placement may have one or more constraints. Gates (e.g., gates 502A and 502B) may be required snap on certain tracks (e.g., 2X or 4X tracks). Also, different gates may have different snap periods. A snap point may not be at the left bottom corner. All gate left-bottom location can be expressed as $$X_{low} = -\text{offset} + P \cdot x \quad (7),$$

where P is the snap period and the offset is a distance between a left edge and the snap point, where w is the gate width.

In some embodiments, for ILP based net alignment with the placement constraints the follow operations may occur. For each gate $g_{r_i,j}$, its new location is:

$$(\text{offset}_{r_i,j} + P_{r_i,j} \cdot x_{r_i,j}) \quad (8).$$

The gate width is $w_{r_i,j}$. The original $X_{low}$ is $$\begin{aligned}(-\text{offset}_{r_i,j} + P_{r_i,j} \cdot x'_{r_i,j}) - \text{offset}_{r_i,j} + P_{r_i,j} \cdot x_{r_i,j} + \\ w_{r_i,j} \leq -\text{offset}_{r_i,j+1} + P_{r_i,j+1} \cdot x_{r_i,j+1} \\ \text{Chip}_{xlow} \leq -\text{offset}_{r_i,0} + P_{r_i,0} \cdot x_{r_i,0} - \text{offset}_{r_i,N} + P_{r_i,N} \cdot \\ X_{r_i,N} + w_{r_i,N} \leq \text{Chip}_{xhigh} |P_{r_i,j} \cdot x_{r_i,j} - P_{r_i,j} \cdot x'_{r_i,j}| \leq d_{move}\end{aligned} \quad (9)$$

The alignment constraints may be represented in the following equations:

$$-\text{offset}_{r_i,j} + P_{r_i,j} \cdot x_{r_i,j} - (-\text{offset}_{r_{i+1},k} + P_{r_{i+1},k} \cdot x_{r_{i+1},k}) \leq U_{r_i,j,k} \quad (10),$$

$$B_{r_i,j,k} \leq -\text{offset}_{r_i,j} + P_{r_i,j} \cdot x_{r_i,j} - (-\text{offset}_{r_{i+1},k} + P_{r_{i+1},k} \cdot x_{r_{i+1},k}) \quad (11).$$

Also, the target may be to minimize the gate location change $\min(d_{move})$.

Figure 6:
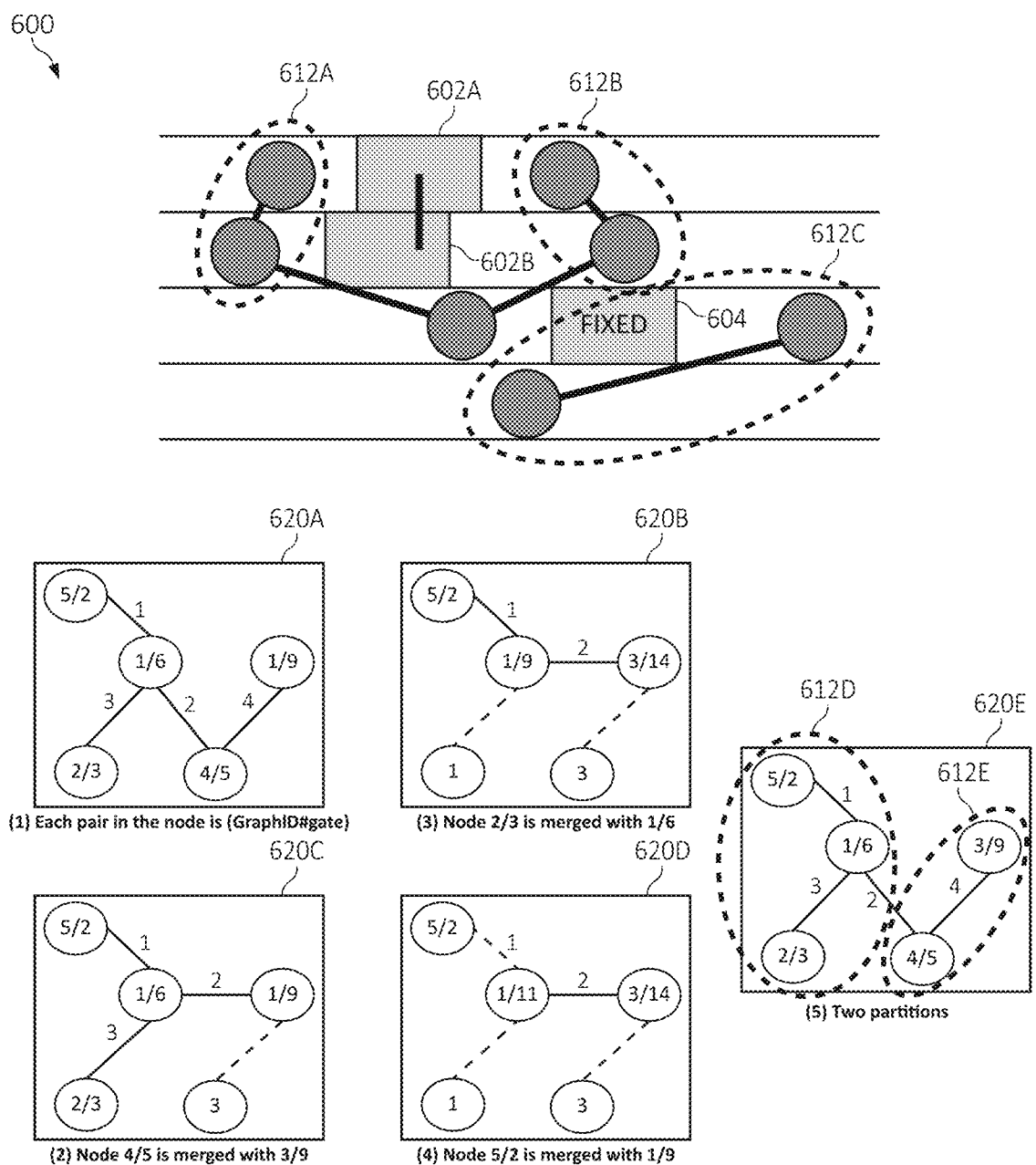
FIG. 6 is a block diagram depicting an exemplary operations for providing Integer Linear Programming ("ILP") based short net pin alignment for routing of an integrated circuit in which aspects of the present invention may be realized.

For further explanation, FIG. 6 is a block diagram depicting an exemplary operations for providing Integer Linear Programming ("ILP") based short net pin alignment for routing of an integrated circuit in which aspects of the present invention may be realized.

In some implementations, the ILP formulation operation for short net pin alignment may apply/cover an entire IC layout design having multiple short nets such as, for example, short nets 612A-C, gates 602A-B, and a fixed gate 604, where the problem size may be large and the probability that not all short nets (e.g., short nets 612A-C) are able to be aligned.

However, the ILP based short net pin alignment can return an optimal solution for short net pin alignment. However, a "no partial solution" may be generated, provided, and/or returned if no feasible solution.

As depicted, the ILP based short net pin alignment may partition the IC layout design into smaller pieces and work in each region independently (e.g., regions shown as dash-circles surround the short nets 612A-C).

In some implementations, the ILP based short net pin alignment may build a net alignment graph 600, as depicted in blocks 620A-E. Graph 600 is a result of graph partition. The graph 600 without ellipses is built based on the netlist. Each ellipse corresponds to one partition. Subgraphs 620 illustrated how to obtain the graph partition.

Each row segment may be represented by a node which records the number of gates it covers. If there are aligned nets between two row segments, an edge is added. The edge cost is the number of aligned nets (or the sum of scores of aligned nets). Partition the graph into several subgraphs such that the number of gates inside each subgraph is less than the given threshold. Each partition constructs an ILP formulation to get the optimal solution. For unaligned nets, a greedy approach can be applied as well if gate ordering is allowed to change.

For alignment graph partition, the graph 600 may be scanned and all independent subgraphs (e.g., blocks 620A-E) may be identified. For each large subgraph S (whose number of nodes is greater than the gate_size_threshold), for each node $n_i$, $n'^s_i$ subgraph ID $g_{n_i} = i$, and merged node list $L_{n_i} = \{\ \}$, the edges may be sorted based on the edge cost in decreasing order.

A loop operation may be performed by identifying the edge $(n_i, n_j)$ to merge. For edge $(n_i, n_j)$ in the edge list, if $|n_i| + |n_j|$ is less than or equal to ("≤") a gate size threshold ("gate_size_threshold"), then the ILP based short net pin alignment may terminate. In FIG. 6, it is assumed that gate size threshold is a value of 15. Otherwise, the nodes $(n_i, n_j)$ of the edge may be merged. It should be noted that the gate size threshold (e.g., the gate_size_threshold) is the maximum number of gates in a cluster. Since the original graph from the netlist could be large, and may have tough memory or runtime issue. Therefore, the operation is to divide the graph into smaller pieces, and process each small subgraph one by one.

For merging two nodes, if a merging edge is identified, then node $n_j$ may be merged to node $n_i$, node $n_j$ may be assigned, and all nodes in $L_{n_j}$ subgraph identifier ("ID") as $g_{n_i}$, and add node $n_j$ and node list $L_{n_j}$ to node list $L_{n_i}$. That is, node $n_j$ being merged to node to node $n_i$ means that node $n_i$ and node $n_j$ will have the same group ID (i.e., $g_{n_i}$). Thus, node $n_j$ is assigned $g_{n_i}$. At the end, nodes with the same group ID belong to the same cluster.

If there are any edges connecting to node $n_j$, the connection may be redirected to node $n_i$. The edges may be resorted. All nodes with a same subgraph ID may belong to the same subgraph. Such is depicted in FIG. 6 where block 620A depicts 1) each pair in the nodes is (GraphID/#gates). That is, each node is labeled with the graph identifier ("GraphId") and the number of gates in the subgraph of GraphId. (Each subgraph is identified by GraphId). At the very beginning, each segment is represented by a node, and is given a unique GraphId. The number of gates inside the segment is #gate. After merging two nodes, for example, node A is merged to node B. Then node B's GraphId may be updated and receive the node A's GraphId. In other words, both node A and node B will have A's GraphId. Also node A's #gate (e.g., number of gates) is the sum of node A's #gate and node B's #gates. Also, node B can be viewed as eliminated from the graph after merging.

In block 620C, nodes 4 and 5 may be merged with nodes 3 and 9. In block 620B, nodes 2 and 3 may be merged with nodes 1 and nodes 6. In block 620C, node 4 and 5 are merged with nodes 3 and 9. IN block 620D, node 5 and 2 are merged with nodes 1 and 9.

Figure 7:
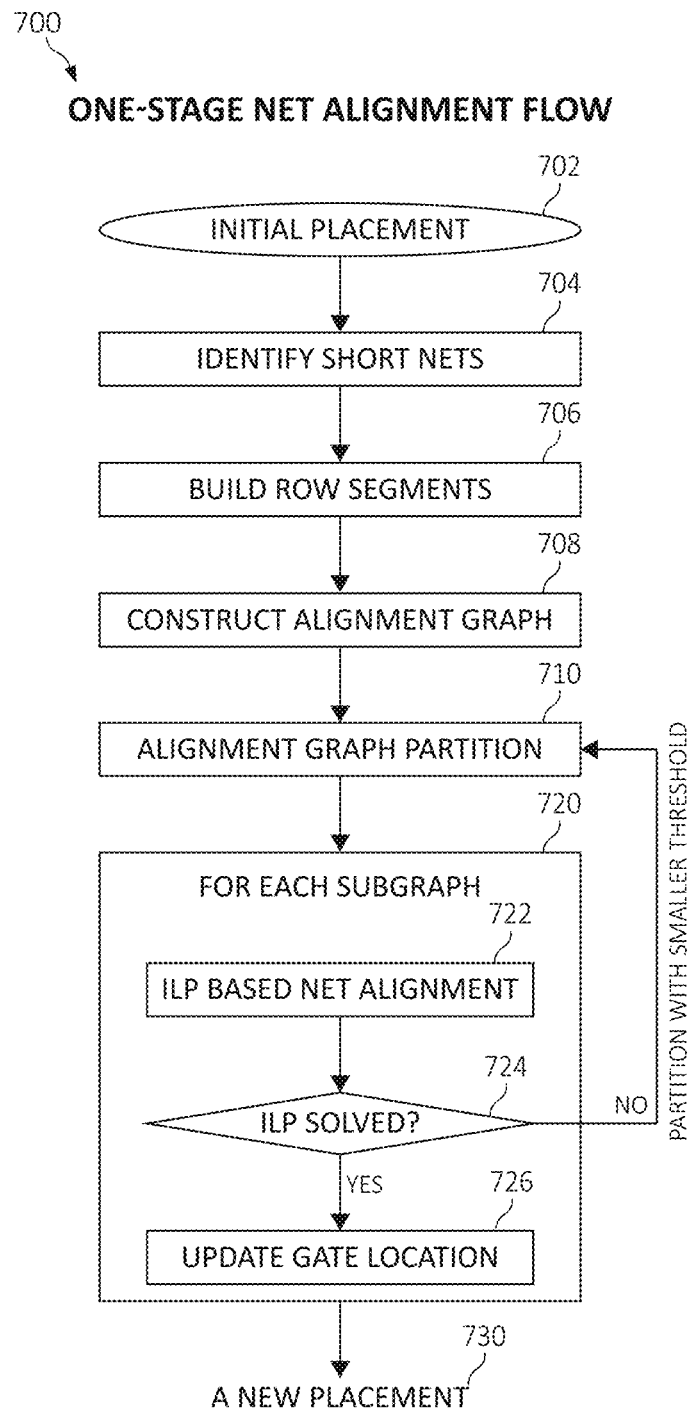
FIG. 7 is a flow diagram depicting an exemplary operations for providing Integer Linear Programming ("ILP") based short net pin alignment for routing of an integrated circuit in which aspects of the present invention may be realized.

For further explanation, FIG. 7 is a flow diagram 700 depicting an exemplary operations for providing Integer Linear Programming ("ILP") based short net pin alignment for routing in which aspects of the present invention may be realized. The functionality 700 may be implemented as a method executed as instructions on a machine, where the instructions are included on at least one computer readable medium or one non-transitory machine-readable storage medium. The functionality 700 may start may an initial placement, as in block 702. The initial placement may be the layout placement of cells within the field of electronic design automation used in the design and fabrication of integrated circuit devices. That is, the initial input is a placed design, i.e., the gates are already placed, and the operation is to adjust gate location locally to achieve the given goals. Also, the initial placement may include some short nets that have been aligned.

In block 704, one or more short nets may be identified. In 706, circuit row segments may be built. That is, during circuit row segment creation, any objects that are fixed or are intended not to be touched/moved, may be considered, and treated as a segment boundary. In block 708, an alignment graph may be constructed. The alignment graph may be partitioned, as in block 710.

For each subgraph 720, an ILP based net alignment operation may be executed, in block 722. An operation may be executed to determine whether or not the ILP based net alignment is solved, as in block 724. If no at block 724, the method 700 returns to block 710. If yes at block 724, the method 700 moves to block 726. At block 726, a gate location may be updated. A new placement may be provided, as in block 730.

It should be noted that if the original aligned short nets (e.g., short nets identified in block 704) are not fixed, this provides more improvement room. However, the corresponding alignment graphs may become larger and thus increase the rate of ILP failure. As such, a two-stage flow is proposed to maximize the improvement. In some implementations, in a first stage (e.g., steps/operations 702-710), all cells may be moved except for fixed objects. In a second stage (e.g., steps/operations 720-726), the fixed objects and gates with aligned short nets are not moved. The difference of the implementation for the two stages is building the row segment. Row segments are defined based on fixed objects.

Figure 8:
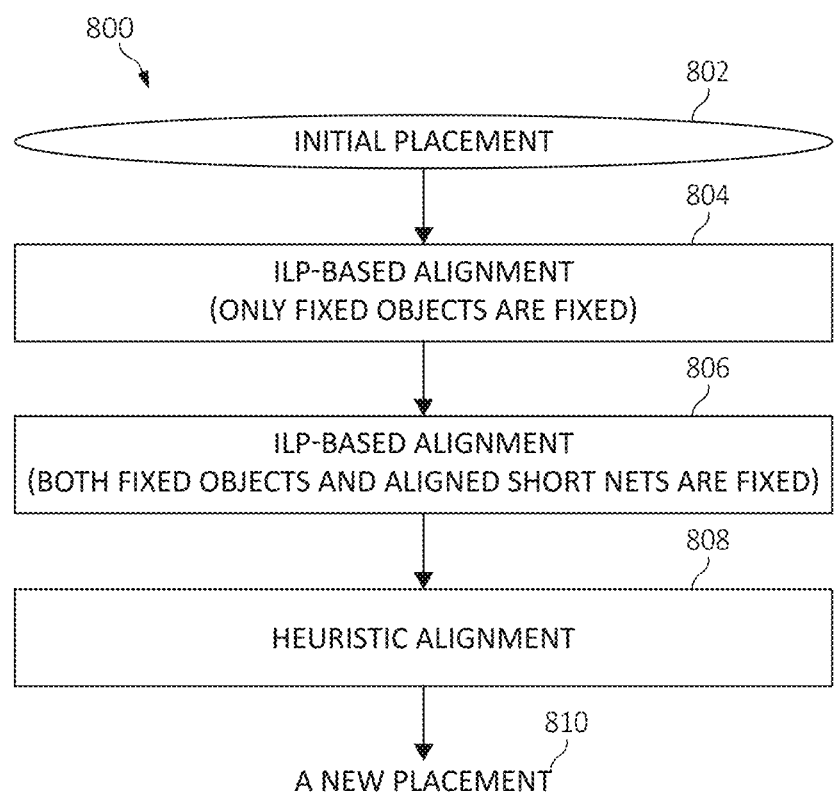
FIG. 8 is a flow diagram depicting an exemplary operations for providing a combination of heuristic and Integer Linear Programming ("ILP") based short net pin alignment operations for routing of an integrated circuit in which aspects of the present invention may be realized

To further illustrate, FIG. 8 is a flow diagram depicting an exemplary operations for providing a combination of heuristic and Integer Linear Programming ("ILP") based short net pin alignment operations for routing of an integrated circuit in which aspects of the present invention may be realized. The functionality 800 may be implemented as a method executed as instructions on a machine, where the instructions are included on at least one computer readable medium or one non-transitory machine-readable storage medium. The functionality 800 may start in block 802 by performing an initial placement operation. The initial placement may be the layout placement of cells within the field of electronic design automation used in the design and fabrication of integrated circuit devices.

In block 804, an ILP-based alignment operation may be performed (only on fixed objects). In block 806, an ILP-based alignment operation may be performed (performed on both fixed objects and aligned short nets). In block 808, a heuristic alignment operation may be performed. A new placement may be provided, as in block 810.

It should be noted that in FIG. 8, the heuristic and ILP operations can be combined to align short nets. For the ILP based approach, an optimal solution may be identified if a solution can be identified by a linear program ("LP") solver. A cell ordering may be maintained and unchanged and cell movement may be minimized. If an LP solver fails, no partial solution is returned.

For the heuristic approach, only one short net is operated on at each time. The net ordering may affect the final results. The original gate ordering may be changed. The combination of the heuristic and ILP operations can maximize a chance of alignment by first applying the ILP-based alignment operation to process the alignment of a majority of the short nets (e.g., a defined range, a percentage amount, or based on a threshold). Second, the heuristic operation may be applied to work on the remaining of the short nets, if any, one-by-one for further improvement.

Figure 9:
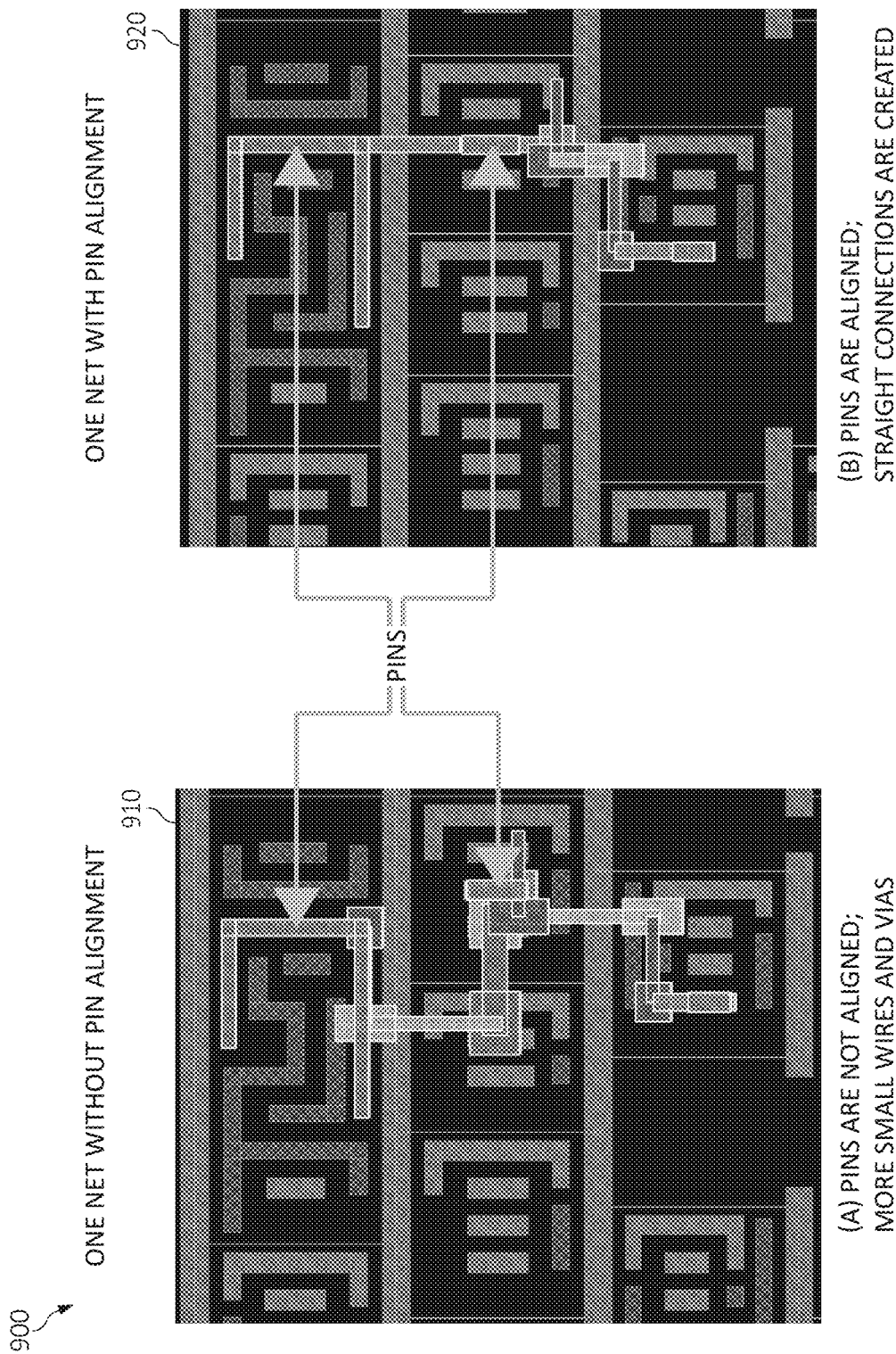
FIG. 9 is a block diagram depicting a short net pin with and without alignment for routing of an integrated circuit in which aspects of the present invention may be realized.

FIG. 9 is a block diagram depicting a short net pin with and without alignment for routing of an integrated circuit in which aspects of the present invention may be realized.

As depicted, IC circuit design 910 depicts short net pins are not aligned which causes an increase in wiring and vias. Alternatively, using the various implementations as described herein, IC circuit design 920 depicts short net pins being aligned with straight wire connections being created.

Figure 10:
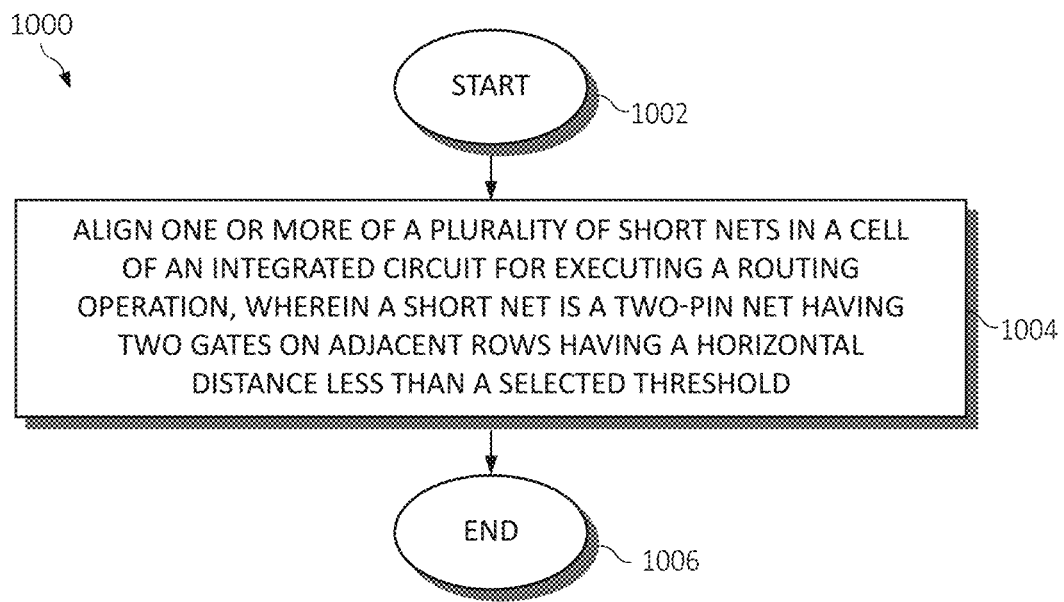
FIG. 10 is a flowchart diagram depicting an exemplary method for providing short net pin alignment for routing of an integrated circuit by a processor, again in which aspects of the present invention may be realized.

Turning now to FIG. 10, a method 1000 for providing short net pin alignment for routing of an integrated circuit using a processor is depicted, in which various aspects of the illustrated embodiments may be implemented. The functionality 1000 may be implemented as a method executed as instructions on a machine, where the instructions are included on at least one computer readable medium or one non-transitory machine-readable storage medium. The functionality 1000 may start in block 1002.

One or more of a plurality of short nets in a cell of an integrated circuit may be aligned for executing a routing operation, where a short net is a two-pin net having two gates on adjacent rows having a horizontal distance less than a selected threshold, as in block 1004. The functionality 1000 may end, as in block 1006.

In one aspect, in conjunction with and/or as part of at least one blocks of FIG. 10, the operation of method 1000 may include each of the following. The operations of 1000 may align a pair of gate pins for the one or more short nets using a heuristic operation. The operations of 1000 may simultaneously align a plurality of gate pin pairs of a plurality of short nets in the cell of the integrated circuit using an integer linear program ("ILP") operation, where the one or more short nets are aligned simultaneously.

The operations of 1000 may identify one or more alignment constraints for aligning the one or more of a plurality of short nets. The operations of 1000 may generate an alignment graph for aligning the one or more of a plurality of short nets, where each node of the alignment graph represents a row segment and indicates a number of gates associated with the node.

The operations of 1000 may identify one or more subgraphs of the alignment graph, wherein a number of gates associated with each subgraph is less than a threshold. The operations of 1000 may align a first set of the plurality of short nets using an integer linear program ("ILP") operation; and align a remaining set of the plurality of short nets using the heuristic operation.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowcharts and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowcharts and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowcharts and/or block diagram block or blocks.

The flowcharts and block diagrams in the Figures illustrate the architecture, functionality, and operation of possible implementations of systems, methods, and computer program products according to various embodiments of the present invention. In this regard, each block in the flowcharts or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts or carry out combinations of special purpose hardware and computer instructions.

The descriptions of the embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for providing enhanced routing in a computing environment by one or more processors comprising:
aligning two or more of a plurality of short nets in a cell of an integrated circuit for executing a routing operation, wherein a short net is a two-pin net having two gates on adjacent rows having a horizontal distance less than a selected threshold, wherein the aligning pertains to the two-pin net of respective short nets of the two or more short nets, and wherein at least two short nets of the plurality of short nets have their pins aligned using an integer linear program ("ILP") operation.

2. The method of claim 1, further including aligning a pair of gate pins for the two or more short nets using a heuristic operation.

3. The method of claim 1, wherein the at least two short nets of the plurality of short nets have their pins aligned using the ILP operation simultaneously.

4. The method of claim 1, further including identifying one or more alignment constraints for aligning the two or more of the plurality of short nets.

5. The method of claim 1, further including generating an alignment graph for aligning the two or more of a plurality of short nets, wherein each node of the alignment graph represents a row segment and indicates a number of gates associated with the node.

6. The method of claim 5, further including:
identifying one or more subgraphs of the alignment graph, wherein a number of gates associated with each subgraph is less than a threshold.

7. The method of claim 1, further including:
aligning a remaining set of the plurality of short nets using a heuristic operation, wherein the remaining set of the plurality of short nets does not include the at least two short nets aligned using the ILP operation.

8. A system for providing enhanced routing in a computing environment in a computing environment, comprising:
one or more computers with executable instructions that when executed cause the system to:
align two or more of a plurality of short nets in a cell of an integrated circuit for executing a routing operation, wherein a short net is a two-pin net having two gates on adjacent rows having a horizontal distance less than a selected threshold, wherein the aligning pertains to the two-pin net of respective short nets of the two or more short nets, and wherein at least two short nets of the plurality of short nets have their pins aligned using an integer linear program ("ILP") operation.

9. The system of claim 8, wherein the executable instructions when executed cause the system to align a pair of gate pins for the two or more short nets using a heuristic operation.

10. The system of claim 8, wherein the at least two short nets of the plurality of short nets have their pins aligned using the ILP operation simultaneously.

11. The system of claim 8, wherein the executable instructions when executed cause the system to identify one or more alignment constraints for aligning the two or more of the plurality of short nets.

12. The system of claim 8, wherein the executable instructions when executed cause the system to generate an alignment graph for aligning the two or more of a plurality of short nets, wherein each node of the alignment graph represents a row segment and indicates a number of gates associated with the node.

13. The system of claim 12, wherein the executable instructions when executed cause the system to identify one or more subgraphs of the alignment graph, wherein a number of gates associated with each subgraph is less than a threshold.

14. The system of claim 8, wherein the executable instructions when executed cause the system to:
align a remaining set of the plurality of short nets using a heuristic operation, wherein the remaining set of the plurality of short nets does not include the at least two short nets aligned using the ILP operation.

15. A computer program product for providing enhanced routing in a computing environment in a computing environment, the computer program product comprising:
one or more computer readable storage media, and program instructions collectively stored on the one or more computer readable storage media, the program instruction comprising:
program instructions to align one or more of a plurality of short nets in a cell of an integrated circuit for executing a routing operation, wherein a short net is a two-pin net having two gates on adjacent rows having a horizontal distance less than a selected threshold, wherein the aligning pertains to the two-pin net of respective short nets of the one or more short nets; and
program instructions to generate an alignment graph for aligning the one or more of the plurality of short nets, wherein each node of the alignment graph represents a row segment and indicates a number of gates associated with the node.

16. The computer program product of claim 15, wherein a pair of gate pins for the one or more short nets is aligned using a heuristic operation.

17. The computer program product of claim 15, wherein a plurality of gate pin pairs of the plurality of short nets in the cell of the integrated circuit are aligned using an integer linear program ("ILP") operation, wherein the one or more short nets are aligned simultaneously.

18. The computer program product of claim 15, further including program instructions to identify one or more alignment constraints for aligning the one or more of a plurality of short nets.

19. The computer program product of claim 15, further including program instructions to:
align a first set of the plurality of short nets using an integer linear program ("ILP") operation; and
align a remaining set of the plurality of short nets using a heuristic operation.

20. The computer program product of claim 15, further including program instructions to identify one or more subgraphs of the alignment graph, wherein a number of gates associated with each subgraph is less than a threshold.

* * * * *